United States Patent
Wyszynski

(10) Patent No.: US 7,444,126 B1
(45) Date of Patent: Oct. 28, 2008

(54) SIGNAL-TO-NOISE OPTIMIZED FULLY MONOLITHIC VIDEO RECEIVER IF CHANNEL

(75) Inventor: Adam Stanislaw Wyszynski, Plano, TX (US)

(73) Assignee: Microtune (Texas), L.P., Plano, TX (US)

(*) Notice: Subject to any disclaimer, the term of this patent is extended or adjusted under 35 U.S.C. 154(b) by 1658 days.

(21) Appl. No.: 08/579,072

(22) Filed: Dec. 22, 1995

(51) Int. Cl.
  *H04B 17/02* (2006.01)
(52) U.S. Cl. .......... 455/136; 455/296; 455/253.2; 455/232.1; 455/311; 455/313; 348/707; 348/14.02; 348/14.01; 348/725; 348/726
(58) Field of Classification Search .......... 455/296, 455/253.2, 232, 311, 313, 341, 334, 566, 455/14; 348/14, 707, 725, 726
See application file for complete search history.

(56) References Cited

U.S. PATENT DOCUMENTS

| | | | |
|---|---|---|---|
| 3,289,088 A | 11/1966 | Berger | 325/408 |
| 3,673,499 A * | 6/1972 | Avins et al. | 455/334 |
| 3,921,077 A | 11/1975 | Suzuki | 325/477 |
| 4,031,469 A | 6/1977 | Johnson | 325/363 |
| 4,081,837 A * | 3/1978 | Tada et al. | 455/296 |
| 4,087,750 A * | 5/1978 | Allen et al. | 455/296 |
| 4,236,254 A * | 11/1980 | Augustin et al. | 455/311 |
| 4,271,433 A * | 6/1981 | Theriault | 348/731 |
| 4,326,297 A * | 4/1982 | Sato et al. | 455/311 |
| 4,344,128 A * | 8/1982 | Frye | 700/78 |
| 4,406,019 A | 9/1983 | Ide et al. | 455/245 |
| 4,466,133 A | 8/1984 | Price | 455/303 |
| 4,581,643 A | 4/1986 | Carlson | |
| 4,606,075 A * | 8/1986 | Eastmond | 455/234.2 |
| 4,726,072 A | 2/1988 | Yamashita et al. | |
| 4,742,566 A | 5/1988 | Nordholt et al. | |
| 4,856,084 A * | 8/1989 | Richards, Jr. | 455/311 |
| 4,979,230 A | 12/1990 | Marz | |
| 4,984,292 A | 1/1991 | Millen | 455/40 |
| 5,038,404 A | 8/1991 | Marz | |
| 5,060,297 A | 10/1991 | Ma et al. | |
| 5,140,198 A | 8/1992 | Atherly et al. | |
| 5,200,826 A | 4/1993 | Seong | |
| 5,287,558 A | 2/1994 | Hansen | 455/296 |
| 5,311,318 A | 5/1994 | Dobrovolny | |

(Continued)

FOREIGN PATENT DOCUMENTS

JP   5167469   *   7/1993   ........... 455/234.1

OTHER PUBLICATIONS

"The New IEEE Standard Dictionary of Electrical and Electronics Terms", pp. 90, 500, 1306, Jan. 1993.*

(Continued)

*Primary Examiner*—Nay Maung
*Assistant Examiner*—Richard Chan
(74) *Attorney, Agent, or Firm*—Fulbright & Jaworski L.L.P.

(57) ABSTRACT

In a video IF channel the gain of the circuit is achieved ahead of the IF filter and the output of the filter, including its noise, need only be amplified a relatively small amount, thus preserving an acceptable signal to noise ratio. In one embodiment, a variable gain amplifier is used as the first stage amplifier and a fixed gain amplifier is used for the output stage.

12 Claims, 1 Drawing Sheet

U.S. PATENT DOCUMENTS

| | | | | |
|---|---|---|---|---|
| 5,321,852 | A | | 6/1994 | Seong |
| 5,361,395 | A | * | 11/1994 | Yamamoto ............... 455/234.1 |
| 5,390,346 | A | | 2/1995 | Marz |
| 5,428,824 | A | * | 6/1995 | Kasai .......................... 455/78 |
| 5,428,836 | A | | 6/1995 | Sanecki et al. |
| 5,491,507 | A | * | 2/1996 | Umezawa et al. ............. 348/14 |
| 5,555,275 | A | * | 9/1996 | Oshima ....................... 375/261 |
| 5,555,550 | A | * | 9/1996 | Kaschke ..................... 455/566 |
| 5,563,545 | A | | 10/1996 | Scheinberg |

OTHER PUBLICATIONS

Millman et al. , "Microelectronics", p. 172, 1987.*

Meyer, Robert G. "A 1-GHz BiCMOS RF Front-End IC." IEEE Journal of Solid-State Circuits; vol. 29 No. 3 (Mar. 1994): 350-355.

Kinget, Peter and Michiel Steyaert. "A 1 GHz CMOS Upconversion Mixer". IEEE Custom Integrated Circuits Conference. (1996) 197-200.

Crols, Jan, and Michel S. J. Steyaert. "A 1.5 GHz Highly Linear CMOS Downconversion Mixer." IEEE Journal of Solid-State Circuits. vol. 30 No. 7 (Jul. 1995). 736-742.

Kuhn, William B., William Stephenson, and Aicha Elshabini-Riad. "A 200 MHz CMOS Q-Enhanced LC Bandpass Filter." IEEE Journal of Solid-State Circuits. vol. 31 No. 8 (Aug. 1996). 1112-1122.

Razavi, Behzad, Kwing F. Lee, Ran-Hong Yan, and Robert G. Swartz. "A 3-GHz 25-mW CMOs Phase-Locked Loop." 1994 Symposium on VLSI Circuits Digest of Technical Papers. (1994). 131-132.

McGinn, Mike. "An Advanced I.F. Amplifier & AFT System Suitable for HDTV." IEEE Transactions on Consumer Electronics. vol. 36 No. 3 (Aug. 1990) 407-414.

Okanobu, Taiwa, Hitoshi Tomiyama, and Hiroshi Arimoto. "Advanced Low Voltage Single Chip Radio IC." IEEE Transactions on Consumer Electronics . vol. 38 No. 3. (Aug. 1992) 465-475.

Crols, Jan, and Michiel Steyaert. "An Analog Integrated Polyphase Filter for a High Performance Low-IF Receiver." 1995 Symposium on VLSI Circuits Digest Of Technical Papers. (1995) 87-88.

Anadigics, Inc. CATV/TV/Cable Modem Upconverter MMIC. Warren NJ (Apr. 22, 1998).

Anadigics Inc. VHF/UHF CATV/TV Tuner Dowconverter. Warren, NJ. (Apr. 22, 1998).

Anadigics, Inc. Anagics Technical Brief. Upconverter MMIC for CATV Preliminary. Warren, NJ. (Jan. 11, 1994).

Racanelli, Marco et al. "RF BiCMOS Technology for Highly Integrated Wireless Systems." 1999 IEEE RFIC Symposium. (1999).

Kimura, Katsuji. "A Bipolar Four-Quadrant Analog Quarter-Square Multiplier Consisting of Unbalanced Emitter-Coupled Pairs and Expansions of Its Input Ranges." IEEE Journal of Solid-State Circuits. vol. 29 No. 1 (Jan. 1994) 46-55.

Archer, John, and John Granlund, and Robert E. Mauzy. "A Broad-Band UHF Mixer Exhibiting High Image Rejection over a Multidecade Baseband Frequency Range." IEEE Journal of Solid-State Circuits, vol. SC-16 No. 4 (Aug. 1981) 385-392.

Boutin, Noel. "Complex Signals: Part 1" RF Featured Technology. (Dec. 1989). 27-75.

"Double-balanced mixer and oscillator" Phillips Semiconductors. (Nov. 7, 1997). 1-11.

Gilbert, Barrie. "Demystifying the Mixer" Analog Devices Inc. (Apr. 1994). 1-58.

Kuhn, William B. "Design of Monolithically Integrated Radio Transceivers" Kansas State University. 1996 /RC/.

Sato, Akihiro, et al. "Development of an Adjustment Free Audio Tuner IC" IEEE Transactions on Consumer Electronics, vol. 42 No. 3. (Aug. 1996). 328-334.

Scheinberg, N., et al., "A GaAs Up Converter Interated Circuit for a Double Conversion Cable TV "Set-Top" Tuner" International Conference on Consumer Electronics. (Jun. 1993). 108-109.

Maier, G.M., et al. "Double Conversion Tuner a Must for the Future?" IEEE Transaction on Consumer Electronics, vol. 38, No. 3. (Aug. 1992). 384-388.

Moloney, Daniel M., et al. "Expanded Bandwidth Requirements in CATV Applications." NCTA Technical Papers. (1992). 200-206.

Gilbert, Barrie and Baines, Rupert. "Fundamentals of Active Mixers" Applied Microwave and Wireless. (1995). 10-27.

Muller, J-E., et al. "A Double-Conversion Broad Band TV Tuner with GaAs ICs." GaAs IC Symposium Technical Digest. (1984). 97-98.

Nakatsuka, T., et al. , "Low Distortion and Low Noise Oscillator Mixer for CATV Converters." GaAs Symposium Technical Digest. (1988). 161-164.

Brady, Vernon, et al. "Development of a Monolithic FET Ka-Band Single Side Band UFConverter and Image Reject Downconverter." GaAs Symposium Technical Digest (Oct. 1989) 189-192.

Ablassmeier, Ulrich, et al. "GaAs FET Upconverter for TV Tuner" IEEE Transactions on Electron Devides, vol. ED-27, No. 6. (Jun. 1980). 1156-1159.

Maas, Stephen A. "A GaAs MESFET Mixer with Very Low Intermodulation" IEEE Transactions on Microwave Theory and Techniques, vol. MTT-35, No. 4. (Apr. 1987). 425-429.

Pratt, William J. "High Linearity HBT Amplifier Targets Multicarrier Systems" RF Design. (Mar. 1996). 47-54.

Pandula, Louis. "Image Reect and Image Canceling Mixers" RF Design. (Apr. 1995). 60-65.

Leffel, Michael. "Intermodulation Distortion in a Multi-Signal Environment" RF Design (Jun. 1995). 78-84.

Meyer, Robert G. "Intermodulation in High-Frequency Bipolar Transistor Integrated-Circuit Mixers." IEEE Journal of Solid-State Circuits, vol. SC-21, No. 4. (Aug. 1986). 534-537.

Giles, Martin. "The LM 1823: A High Quality TV Video I.F. Amplifier and Synchronous Detector for Cable Receivers." National Semiconductor Corporation. (Mar. 1985). 1-16.

Svelto, F., et al. "A Low-Voltage Topology After CMOS RF Mixers." IEEE Transactions on Consumer Electronics., vol. 45, No. 2 (May 1999). 299-309.

Otaka, Shoji, et al. "A Low Local Input Power 1.9 GHz Si-Bipolar Quadrature Modulator without Any Adjustment." Bipolar/BiCMOS Circuits and Technology Meeting. (1994). 171-174.

Gilbert, Barrie. "The MICROMIXER: A highly Linear Variant of the Gilbert Mixer using a bisymmetric Class-AB Input Stage" IEEE Journal of Solid-State Circuits, vol. 32, No. 9, (Sep. 1997). 1412-1423.

Ducourant, Thierry, et al. "A 3 Chip GaAs Double Conversion TV Tuner System with 70 db Image Rejection." Monolithic Circuits Symposium Digest of Papers. (1988). 87-90.

Torji, K., et al. "monolithic Integrated VHF TV Tuner." IEEE Transactions on Consumer Electronics, vol. CE-26. (May 1980). 180-189.

Altes, Stephen K., et al. "Monolithic RC All-Pass Networks with Constant-Phase-Difference Outputs." IEEE Transactions on Microwave Theory and Techniques, vol. MTT-34, No. 12. (Dec. 1986). 1533-1537.

MC13143: Ultra Low Power DC-2.4 GHz Linear Mixer. Motorola, Inc. Issue 2. (1996). 1-8.

HP 8516A and HP 8562A/B Portable Spectrum Analyzers. Hewlett-Packard. (Jul. 1989).

MC44302: Advanced Multi-Standard TV Video/Sound IF. Motorola, Inc. (Jun. 17, 1994).

"NCTA Reccomended Practices for Measurements on Cable Television Systems." National Cable Television Association. 2nd Ed. (1993). 1-13.

Maier, Gerd M. "New System Approach to TV Tuner Design." IEEE Transactions on Consumer Electronics, vol. 36, No. 3. (Aug. 1990). 403-406.

Charbon, Edoardo, et al. "A Performance-Driven Routeer for RF and Microwave Analog Circuit Design." Department of Electrical Engineering and Computer Sciences, University of California, Berkeley. 1992.

Koullias,Iconomos, A., et al. "A 900MHz Transceiver Chip Set for Dual-Mode Cellular Mobile Terminals." IEEE International Solid-State Circuits Conference. (1993). 140-141.

McDonald, Mark D. "A 2.5GHz BiCMOS Image-Reject Front-End" IEEE International Solid-State Circuits Conference. (1993). 144-145.

Lovelace, David, et al. "Silicon Upconverter RF IC Simplifies Cable Modem Designs" Microwaves & RF (Mar. 1997). 136-142.

Lovelace, David, et al. "Innovative Simulator Models Silicon Upconverter RF IC" Microwaves & RF. (Apr. 1997). 106-109.

Farmer, James O. "Specifications for Tuner Design for use in Cable Ready Television Receivers and VCRs." IEEE Transactions on Consumer Electronics, vol. 36, No. 3,. (Aug. 1990). 660-668.

Abidi, Asad A. "Direct-Conversion Radio Transceivers for Digital Communications." IEEE International Solid-State Circuits Conference. (1995). 186-187; 363-364.

Kokozinski, Rainer, et al. "Microwave Wideband Amplifiers In Bulk-CMOS/SIMOX Technologies." IEEE International Solid-State Circuits Conference. (1995). 146-147; 188-189.

Kimura, Katsuji. "The Ultra-Multi-Tanh Technique for Bipolar Linear Transconductance Amplifiers." IEEE Transactions on Circuits and Systems-1: Fundamental Theory and Applications. vol. 44, No. 4. (Apr. 1997). 288-302.

Al-Hashimi, Bashir. "Understand the Fundamentals of Passive Video Filters." Microwaves & RF. (May 1996). 171-178.

Long, John R., et al. "A Low-Voltage Silicon Bipolar RF Front-End for PCN Receiver Applications." IEEE International Solid-State Circuits Conference. (1995). 104-105; 140-141.

Sabin, William E. & Edgar O. Schoenike. "Single -Sideband Systems & Circuits." McGraw Hill Book Company. New York. (1987). 88-134, 181-213.

* cited by examiner

SIGNAL-TO-NOISE OPTIMIZED FULLY MONOLITHIC VIDEO RECEIVER IF CHANNEL

TECHNICAL FIELD OF THE INVENTION

This invention relates to a video-receiver IF channel, and more particularly, to partitioning the gains in the IF channel so that the signal-to-noise ratio is optimized in a fully monolithic video receiver.

BACKGROUND OF THE INVENTION

If a video-receiver is to be fully integrated, then a monolithic filter must be used, as opposed to a partially integrated or a discrete receiver using a discrete filter. In the case of a partially integrated receiver using a discrete filter, a problem is created in that the system would have to be provided with a board, and more than likely, a metal case around it, which is relatively costly.

Fully-monolithic receivers differ from their discrete counterparts primarily due to a lack of low-loss monolithic inductors. For this reason, most of the filtering function on such receivers must be realized with active simulations of inductors. However, active fully-monolithic intermediate frequency (IF) filter-amplifiers suffer from detrimental noise characteristics of the active devices required to simulate inductors. This performance is further aggravated in the case of an IF filter-amplifier providing additional high-gain to the channel.

In a discrete realization, placing a variable gain amplifier (VGA) after an IF filter, helps its noise performance by band limiting, since a discrete inductance/capacitance (LC) IF filter is practically noiseless. However, in a fully-monolithic circuit, placing a high-gain VGA after the IF filter, which is the major source of noise, results in a substantially increased noise level leading to a reduced signal-to-noise (S/N) ratio. Moreover, in such a structure, the distortion of the filter changes with a widely varying signal, such that if the linearity is made sufficient for the highest signal levels, it becomes suboptimal for the low signal levels.

In the case of low-VGA gain, the IF channel noise performance is acceptable. However, in the high-gain case, the amplitude of the input signal to the filter is the amplitude of the output signal divided by the gain of the VGA, and such a reduced input signal to the filter results in a substantial deterioration of the system S/N ratio. The S/N ratio is defined as the ratio of the maximum undistorted rms input signal of the filter to the input referred noise of the filter.

Accordingly, there is needed a fully monolithic IF channel which allows a wide gain range while still maintaining an acceptable S/N ratio, all without using off-circuit LC devices.

It is, therefore, an object of the present invention to provide a fully-monolithic IF channel receiver system that has the improved signal processing noise capabilities.

Another object of the invention is to provide a fully-monolithic receiver, therefore reducing its manufacturing cost.

Yet another object of the present invention is to provide the IF band-pass filter with the maximum possible input signal in order to maintain the signal/noise ratio.

A further object of the present invention is to provide a constant signal level input to the IF band-pass filter, and therefore, optimize its linear range and distortion, and save dissipated power.

SUMMARY OF THE INVENTION

In accordance with the present invention, a modified configuration of a fully-monolithic active IF channel is provided. The system consists of two amplifiers, a VGA (a variable gain amplifier), and an FGA (a fixed gain amplifier), as well as two filters. A low-pass filter precedes the VGA, and an intermediate frequency band-pass filter follows the VGA and precedes the FGA.

In order to achieve an optimum S/N ratio condition, a filter should always operate with the maximum possible input signal. Therefore, a VGA precedes the IF band-pass filter, which is then followed by an FGA. In such a configuration, the maximum possible gain is applied by the VGA in front of the filter, so that only a portion of the gain, that of the FGA after the filter, amplifies its noise. Additionally, the input referred noise of the present system becomes the input referred noise of a VGA which can be made lower than that of an IF filter.

One technical advantage to the present configuration, is that since the signal input level to the filter is kept constant, its linear range can be optimized so that the distortion is always maintained within the specification. Moreover, no matter what the input signal to the channel is, the filter always utilizes the entire amount of the available linear range, which directly translates into a saving of dissipated power.

The present invention has only small changes in its S/N ratio, and in the worst case it has a S/N ratio that is several tens of dBs better when compared to the classical solution. Moreover, the net improvement in the S/N ratio between the worst case for the classical solution and the worst case for the present invention, is equal to the ratio of the maximum VGA gain in the classical case over the FGA gain in the present invention, multiplied by the input referred noise of the VGA in the present invention over the input referred noise of the IF filter, which for both cases is assumed to be the same.

Thus, in accordance with one aspect of the present invention, there is provided a monolithic system for processing radio frequency (RF) signals, which includes an amplifier for bringing the input signal up to a level for processing by an IF monolithic filter whereby the output of the filter is sent to an FGA. Preferably, a first filter is used ahead of the first amplifier to reduce noise and distortion falling in the higher bands, and this filter is a low-pass filter. The second filter is an intermediate frequency, band-pass filter. Also, preferably, the first amplifier would be a VGA and the second amplifier would be an FGA.

In accordance with another aspect of the present invention, there is provided a method for processing RF signals, comprising the steps of receiving an input RF signal; mixing the input RF signal with an operating frequency signal to generate a first signal; filtering the first signal to get generate a second signal; amplifying the second signal to generate a third signal; filtering the third signal to generate a fourth signal; and amplifying the fourth signal to generate a fifth signal.

Preferably, the step of filtering the first signal to generate a second signal includes processing the first signal through a low-pass filter. Also, preferably, the step of amplifying the second signal to generate a third signal includes amplifying the second signal by a VGA.

With respect to additional preferred embodiments, the step of filtering the third signal to generate a fourth signal includes processing the third signal through an intermediate-frequency band-pass filter. Also, the step of amplifying the fourth signal to generate a fifth signal includes amplifying the fourth signal by an FGA.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 2:
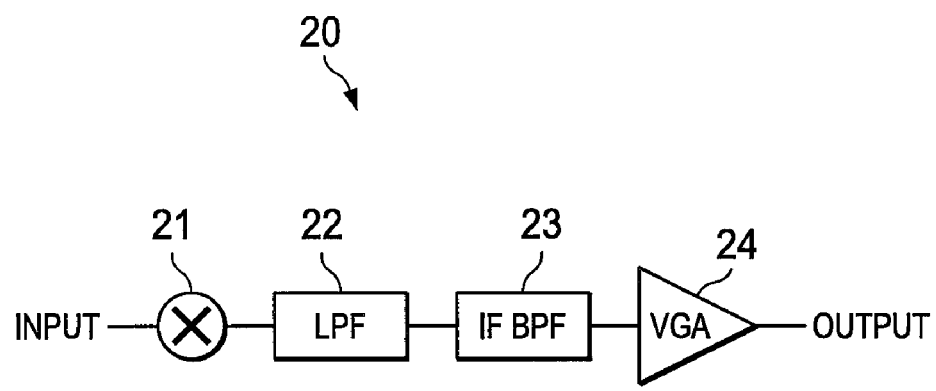
FIG. 2 is a schematic representation of a prior art discrete video-receiver.

Before beginning a discussion of the operation of the invention, it might be well to review the prior art discrete circuits in relation to FIG. 2.

FIG. 2 describes the classical arrangement for an IF channel. It consists of mixer 21, which is then connected to low-pass filter 22. The output signal from LPF 22 is then passed through an IF band-pass filter 23. Because the channel is discrete, and the IF filter is either an LC Network with some discrete amplifiers or a SAW (surface acoustic wave) filter, the noise through this IF filter is minimal. After the IF filter, the signal enters variable gain amplifier (VGA) 24, which can have a maximum gain as high as 10,000.

Figure 1:
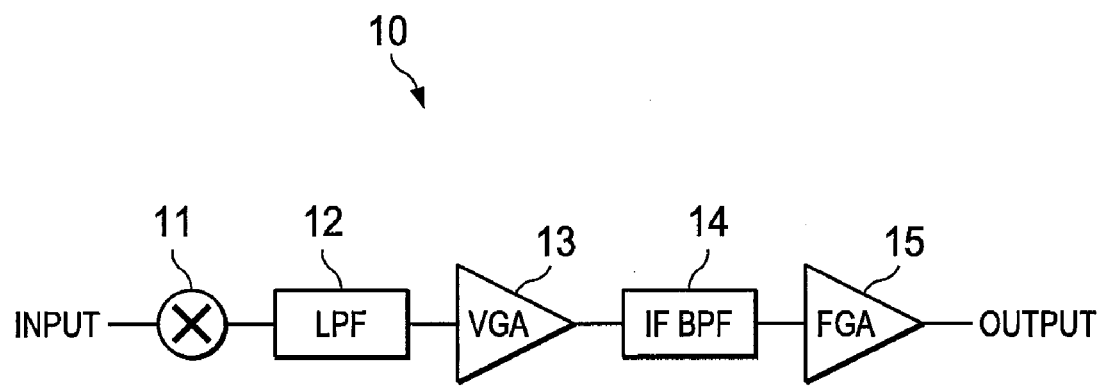
FIG. 1 is a schematic representation of the fully-monolithic IF channel video-receiver according to the present invention.

FIG. 1 shows the present invention, which changes the gain partitioning in the channel as compared to the prior art shown in FIG. 2. As in the discrete receiver, the first block is mixer 11, followed by a low-pass filter 12. Next, comes VGA 13 in front of IF band-pass filter 14, which is then followed by fixed gain amplifier (FGA) 15. The advantage of this improvement is to partition gains so that the signal in front of IF filter 14 is maximized. The input signal to IF filter 14 advantageously should be the maximum possible signal that the filter can receive.

Therefore, in the preferred embodiment, VGA 13 has the characteristic that it can amplify the signal coming from the mixer to the maximum level that the IF filter can take. If additional gain is needed, this gain is provided by the FGA 15. Since the output level of IF band-pass filter 14 is a known level, a fixed gain amplifier can be used as the last stage. Any noise induced by IF band-pass filter 14 is only amplified by the FGA gain and not by say 10,000, as in the worst case of the prior art.

One problem is that the input signal level to VGA 13 varies, in that it can be weak or strong in an unpredictable fashion. The present invention controls this situation by use of a variable gain, such as VGA 13, such that its output signal is constant. This constant value is the maximum that the IF filter can accept which depends on the definition of distortion in the system. Therefore, a level of distortion must be chosen, and then the remaining components can be decided upon. If the IF stage can take the full gain, the output amplifier would not be required.

In one preferred embodiment, if the distortion level is chosen at 1%, and this is achieved for 200 mV input signal to the IF filter, then the output signal of VGA 13 should never exceed 200 mV. Otherwise, distortion greater than 1% would be introduced into the IF filter.

Note, that while a single substrate is contemplated, the monolithic device can have more than one substrate. Also note that, while video is discussed, this concept could be used with any IF communication channel.

The present invention, therefore, is well adapted to carry out the objects and obtain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A system for processing radio frequency (RF) signals comprising:
   an input to said circuit for receiving an RF signal;
   a mixer having an input connected to said RF signal input;
   a first filter having an input connected to an output of said mixer, wherein said first filter is a low-pass filter;
   a first amplifier having an input connected to an output of said first filter, wherein said first amplifier operates to amplify an output signal from said first filter to a maximum level acceptable as an input to said second filter to avoid distortion of said RF signal;
   a second filter having an input connected to an output of said first amplifier; and
   a second amplifier having an input connected to an output of said second filter, and an output connected to an output of said circuit;
   wherein said mixer, said first and second filters and said first and second amplifiers are constructed on a single integrated circuit substrate.

2. The system as claimed in claim 1, wherein said first amplifier means is a variable gain amplifier (VGA).

3. The system as claimed in claim 1, wherein said second filter means is an intermediate frequency, band-pass filter.

4. The system as claimed in claim 1, wherein said second amplifier means is a fixed gain amplifier (FGA).

5. A method of processing radio frequency (RF) signals, the method comprising the steps of:
   receiving an input RF signal;
   mixing said input RF signal with an operating frequency signal to generate a first signal;
   filtering said first signal to generate a second signal, wherein said filtering said first signal includes processing said first signal through a low-pass filter;
   amplifying to a fixed level said second signal to generate a third signal, wherein said amplifying said second signal to generate a third signal includes amplifying said second signal by a variable gain amplifier (VGA), the limit of said VGA being the maximum level acceptable by said third signal filtering step without distortion;
   filtering said third signal to generate a fourth signal; and
   amplifying said fourth signal a fixed amount to generate a fifth signal;
   wherein said mixing, filtering and amplifying steps are performed on a single integrated circuit substrate.

6. A method for processing RF signals as recited in claim 5, wherein the step of filtering said third signal to generate a fourth signal includes processing said third signal through an intermediate-frequency, band-pass filter.

7. A method of processing RF signals as recited in claim 6, wherein said step of amplifying said fourth signal to generate a fifth signal includes amplifying said fourth signal by a fixed gain amplifier (FGA).

8. The circuit of claim 1 wherein said RF signal is a video signal.

9. The method of claim 5 wherein said amplifying to a fixed level step amplifies said second signal to a specific level that is a maximum level acceptable as an input to a filter to avoid distortion of said RF signal.

10. The method of claim 9 wherein said RF signal is a video signal.

11. A radio frequency (RF) signal processing circuit comprising:
   a mixer coupled to an RF signal input;
   a variable gain amplifier coupled to said mixer, wherein said variable gain amplifier amplifies IF signals received from said mixer to a particular signal level, said particular signal level corresponding to the maximum signal level that can be accepted by a filter without distorting said RF signal;
   said filter coupled to an output of said variable gain amplifier and operable to pass frequencies in a selected IF band, while simultaneously attenuating signals having frequencies outside of said IF band; and
   an amplifier coupled to an output of said filter;
   wherein said mixer, said filter, and said amplifiers are physically located on a single integrated circuit substrate.

12. The method of processing an RF signal comprising the steps of:
   inputting said RF signal to a mixer;
   mixing said RF signal to create an intermediate frequency (IF) signal;
   filtering said IF signal to remove high frequency signals, thereby creating a first filtered IF signal;
   amplifying said first filtered IF signal to a selected signal level, thereby generating an amplified, first filtered IF signal, said selected signal level corresponding to the maximum level acceptable as an input to a band-pass filter to avoid distortion of said signal;
   filtering said amplified, first filtered IF signal in said band-pass filter, wherein said band-pass filter attenuates signals having frequencies above and below an IF frequency band, thereby generating a second filtered IF signal; and
   amplifying said second filtered IF signal;
   wherein said mixing step, said filtering steps, and said amplifying steps are conducted in circuits that are physically located on a single integrated circuit substrate.

* * * * *